(12) United States Patent
Theuss et al.

(10) Patent No.: US 8,362,579 B2
(45) Date of Patent: Jan. 29, 2013

(54) SEMICONDUCTOR DEVICE INCLUDING A MAGNETIC SENSOR CHIP

(75) Inventors: Horst Theuss, Wenzenbach (DE); Klaus Elian, Alteglofsheim (DE); Martin Petz, Hohenkammer (DE)

(73) Assignee: Infineon Technologies AG, Neubiberg (DE)

( * ) Notice: Subject to any disclaimer, the term of this patent is extended or adjusted under 35 U.S.C. 154(b) by 417 days.

(21) Appl. No.: 12/469,512

(22) Filed: May 20, 2009

(65) Prior Publication Data

US 2010/0295140 A1    Nov. 25, 2010

(51) Int. Cl.
*H01L 29/82* (2006.01)
(52) U.S. Cl. . 257/421; 257/422; 257/427; 257/E29.323; 438/3
(58) Field of Classification Search ........... 257/421, 257/E29.323; 438/3
See application file for complete search history.

(56) References Cited

U.S. PATENT DOCUMENTS

| | | | |
|---|---|---|---|
| 4,053,826 A | 10/1977 | Wasawa et al. | |
| 5,210,493 A | 5/1993 | Schroeder et al. | |
| 5,315,245 A | 5/1994 | Schroeder et al. | |
| 6,054,210 A * | 4/2000 | Bryant et al. | 428/328 |
| 6,274,939 B1 | 8/2001 | Wolf | |
| 7,250,760 B2 | 7/2007 | Ao | |
| 8,080,993 B2 | 12/2011 | Theuss et al. | |
| 2004/0150091 A1 * | 8/2004 | Stobbs | 257/687 |
| 2007/0145972 A1 * | 6/2007 | Auburger et al. | 324/252 |
| 2008/0135959 A1 | 6/2008 | Theuss et al. | |
| 2009/0140725 A1 * | 6/2009 | Ausserlechner | 324/207.2 |
| 2009/0243595 A1 * | 10/2009 | Theuss et al. | 324/207.11 |
| 2009/0295381 A1 * | 12/2009 | Theuss et al. | 324/252 |
| 2010/0201356 A1 | 8/2010 | Koller et al. | |
| 2010/0276769 A1 * | 11/2010 | Theuss et al. | 257/421 |

FOREIGN PATENT DOCUMENTS

| | | |
|---|---|---|
| DE | 2614328 | 10/1976 |
| DE | 102004010126 | 9/2004 |
| DE | 102009013510 | 10/2009 |
| DE | 102010000389 | 8/2010 |
| JP | 61061481 | 3/1986 |
| JP | 2002271258 | 9/2002 |
| JP | 2007325137 | 12/2007 |

OTHER PUBLICATIONS

The Concise Colour Science Dictionary, (Oxford University Press, 1997, pp. 672-673).*

* cited by examiner

*Primary Examiner* — Jami M Valentine
(74) *Attorney, Agent, or Firm* — Dicke, Billig & Czaja, PLLC

(57) ABSTRACT

A semiconductor device includes a housing defining a cavity, a magnetic sensor chip disposed in the cavity, and mold material covering the magnetic sensor chip and substantially filling the cavity. One of the housing or the mold material is ferromagnetic, and the other one of the housing or the mold material is non-ferromagnetic.

23 Claims, 7 Drawing Sheets

SEMICONDUCTOR DEVICE INCLUDING A MAGNETIC SENSOR CHIP

BACKGROUND

Magnetic field sensors include a semiconductor chip and a magnet oriented to direct magnetic filed lines through a sensing portion of the chip. Magnetic field sensors are usefully employed as position sensors or rate-of-rotation sensors.

One example of a magnetic field sensor includes a chip sensor attached to a leadframe. The chip sensor is provided to a customer who positions the chip sensor between a permanent magnet and a movable component, such as a gear wheel. It is possible that the customer may bend the leadframe in order to position the chip sensor in a preferred orientation. Apart from the preferred orientation, during use it may nevertheless be difficult to realize perpendicular magnetic field penetration through the chip sensor. Both of the above noted aspects related to the use of conventional magnetic field sensors are undesirable.

Another example of a magnetic field sensor includes a chip sensor package that is positioned relative to a multi-pole magnetic gear wheel. In this case, the gear wheel provides the magnetic field. Such multi-pole magnetic gear wheels are complex and expensive, and the chip sensor package is still subject to the undesirable limitations noted above.

For these and other reasons, there is a need for the present invention.

SUMMARY

One aspect provides a semiconductor device including a housing defining a cavity, a magnetic sensor chip disposed in the cavity, and mold material covering the magnetic sensor chip and substantially filling the cavity. One of the housing or the mold material is ferromagnetic, and the other one of the housing or the mold material is non-ferromagnetic.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
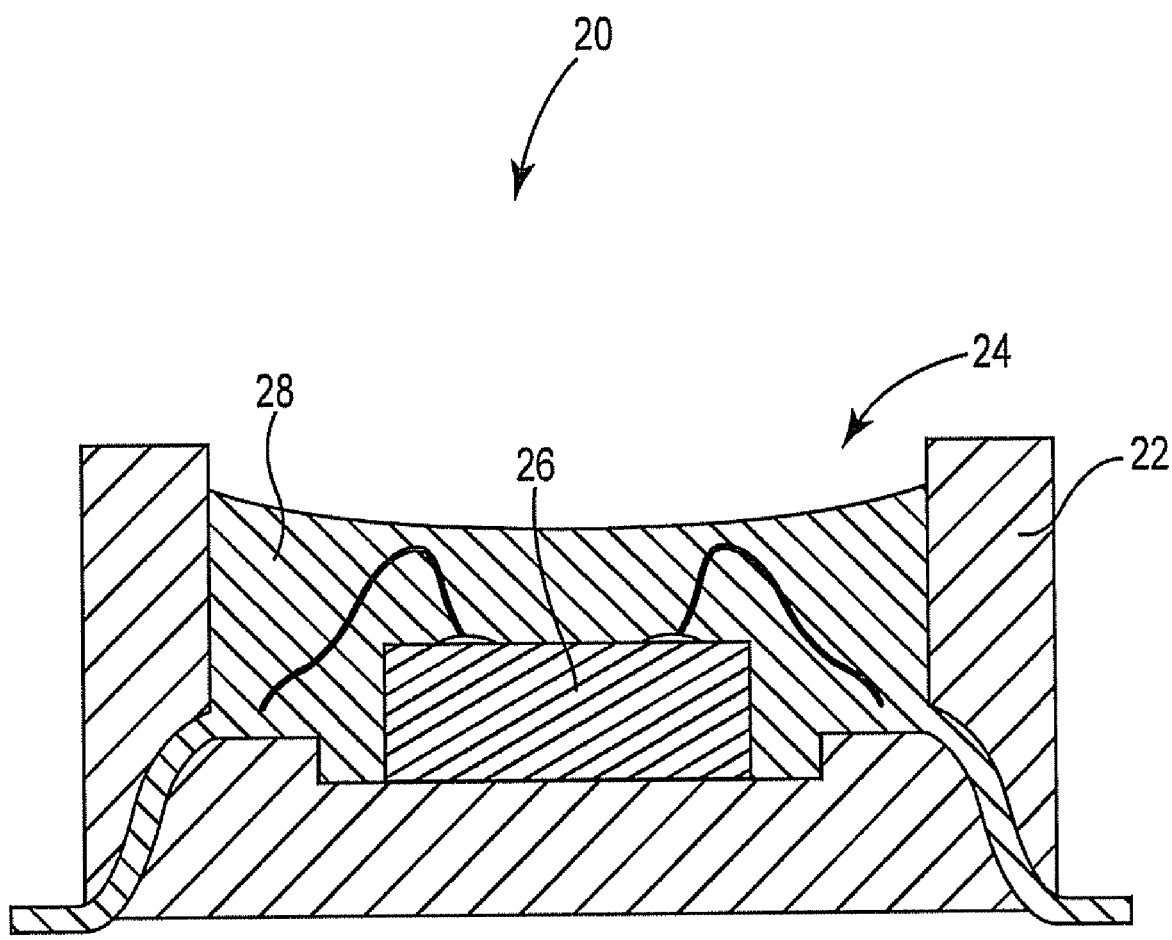
FIG. 1 is a schematic cross-sectional view of a semiconductor device including a housing defining a cavity and mold material deposited into the cavity according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of fabricating such semiconductor devices may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings, one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

The semiconductor chips may become covered with an encapsulant material. The encapsulant material can be any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, fan-out embedded dies can be fabricated. The fan-out embedded dies can be arranged in an array having the form e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a magnetic sensor package including an integrally cast permanent magnet. In one embodiment, the magnetic sensor package includes a housing defining a cavity, a magnetic sensor chip disposed in the cavity, and magnetic mold material covering the magnetic sensor chip and substantially filling the cavity.

In one embodiment, the magnetic sensor package includes a housing defining a cavity, a magnetic sensor chip disposed in the cavity, where the housing is magnetic and includes mold material covering the magnetic sensor chip and substantially filling the cavity.

The magnetic sensor chip and a permanent magnet are integrated into the semiconductor package which is configured to measure a magnetic field or changes in a magnetic field. The magnetic sensor chip in one embodiment measures a quantity defining the magnetic field, such as magnetic field strength or changes in magnetic field strength. In one embodiment, the magnetic sensor chip is configured to sense if the magnetic field exceeds a predetermined threshold value. In one example, the magnetic sensor chip is configured as a Hall sensor or a giant magneto-resistive sensor configured to measure magnetic field strength. To this end, in one embodiment the magnetic sensor chip includes circuits that drive a magnetic sensor and/or evaluate the measurement of signals recorded by the magnetic sensor. In another embodiment, the control and evaluation circuits are integrated into another semiconductor chip that interacts with the magnetic sensor chip.

Giant magneto-resistance (GMR) is a quantum mechanical effect observed in thin film structures having ferromagnetic and non-magnetic layers. GMR is characterized by a significant decrease in electrical resistance when the GMR device is in the presence of a magnetic field. In the absence of an external magnetic field, the direction of magnetization in the ferromagnetic layers of the GMR device is anti-parallel due to weak anti-ferromagnetic coupling between the layers. The result is relatively high resistance in the magnetic scattering. When an external magnetic field is applied to a GMR device, the magnetization of the adjacent ferromagnetic layers is parallel. The result is lower magnetic scattering and lower electrical resistance. The ferromagnetic layers are formed of ferromagnetic material characterized by coercivity.

In this specification, the coercivity of a ferromagnetic material is defined to be the intensity of an applied magnetic field employed to reduce the magnetization of that material to zero after the magnetization of the sample has been driven to saturation. Coercivity is usually measured in Oersteds (or ampere/meter) and is denoted $H_C$.

Hard magnetic materials are considered ferromagnetic and have a high coercivity of greater than 2,000 Oersteds. For example, NdFeB has a coercivity between approximately 10,000-12,000 Oersteds.

Soft magnetic materials are considered ferromagnetic and have a low coercivity of less than 1,000 Oersteds. For example, cobalt has a coercivity of approximately 2 Oersteds.

FIG. 1 is a schematic cross-sectional view of a semiconductor device 20 according to one embodiment. Semiconductor device 20 is configured as a magnetic sensor package suitable for use as a position sensor or a rate-of-rotation sensor. Semiconductor device 20 includes a housing 22 defining a cavity 24, a magnetic sensor chip 26 disposed in cavity 24, and mold material 28 covering magnetic sensor chip 26 and substantially filling cavity 24. In one embodiment, housing 22 is molded of magnetic material and mold material 28 is non-magnetic. In one embodiment, housing 22 is formed of a non-magnetic material, and mold material 28 is magnetic and cast from a polymer system including permanent magnetic particles distributed in a polymer.

Figure 2:
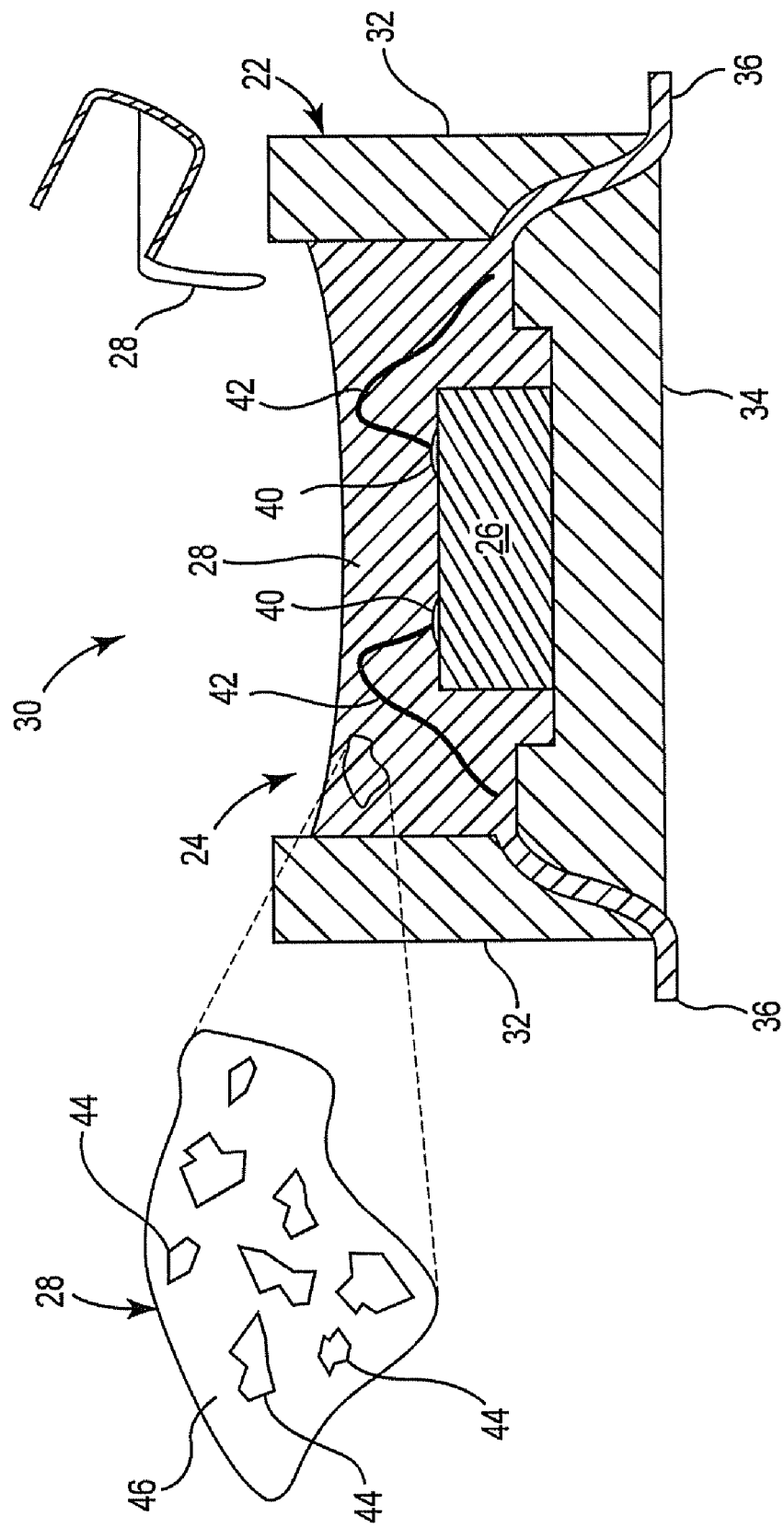
FIG. 2 is a schematic cross-sectional view of magnetic mold material cast into the cavity of a housing and deposited over a magnetic sensor chip according to one embodiment.

FIG. 2 is a schematic cross-sectional view of an exemplary embodiment of a semiconductor device 30 in which housing 22 is non-magnetic and mold material 28 is magnetic.

In one embodiment, housing 22 is formed in the shape of a cup from non-magnetic material and includes sides 32 extending from a bottom 34 and external contact elements 36 communicating between an exterior of housing 22 and cavity 24. For example, housing 22 is molded from a plastic material around a copper leadframe that provides the contact elements 36. Suitable non-magnetic materials for housing 22 include plastic, epoxy, or metals. In one exemplary embodiment housing 22 is formed of an epoxy binder filled with silicon dioxide particles. In another exemplary embodiment housing 22 is molded from a plastic material such as a thermo-plastic material or a thermoset material. In one embodiment, housing 22 is formed of copper and is substantially non-magnetic.

Magnetic sensor chip 26 is attached to base 34 of housing and includes contact pads 40 configured for electrical attachment with external contact elements 36. In one embodiment, magnetic sensor chip 26 electrically communicates with external contact elements 36 by wires 42 that are soldered between external contact elements 36 and contact pads 40.

Other suitable connection mechanisms such as clips or other conducting lines are also acceptable.

Mold material 28 is cast into cavity 24 to protectively cover magnetic sensor chip 26 and the connectors extending between chip 26 and external contact elements 36. In one embodiment, mold material 28 is magnetic and includes permanent magnetic particles 44 distributed in a polymer 46.

In one embodiment, magnetic particles 44 include soft magnetic particles having a low coercivity of less than about 1,000 Oersteds. Suitable soft magnetic particles include Fe, FeSi, FeNi, FeCo, Ni, or other low coercivity magnetic particles. In one embodiment, magnetic particles 44 include hard magnetic particles having a relatively high coercivity of more than 2,000 Oersteds. Suitable hard magnetic particles include NdFeB, SmCo, AlNiCo, ferrites or other high coercivity particles. Particles 44 are distributed in polymer 46 and have a mean particle diameter of between approximately 20-150 micrometers.

In one embodiment, polymer 46 is provided as a liquid polymer binder including a catalyst of, for example, strong acid or a photo-acid generator. Such a liquid polymer binder may be thermally cured or light cured (as in the case where the polymer includes a photo-acid generator). In one embodiment, polymer 46 includes a fluoropolymer configured to be cross-linked and thus hardened at temperatures above 100 degrees Celsius. In one embodiment, polymer 46 includes silicone that is thermally cross-linked to a hardened material that protectively covers magnetic sensor chip 26.

FIG. 2 illustrates one method of manufacturing semiconductor device 30 that includes providing a carrier in the form of housing 22 forming cavity 24; placing chip 26 into cavity 24; and casting magnetic material 28 into cavity 24 and over chip 26.

Figure 3:
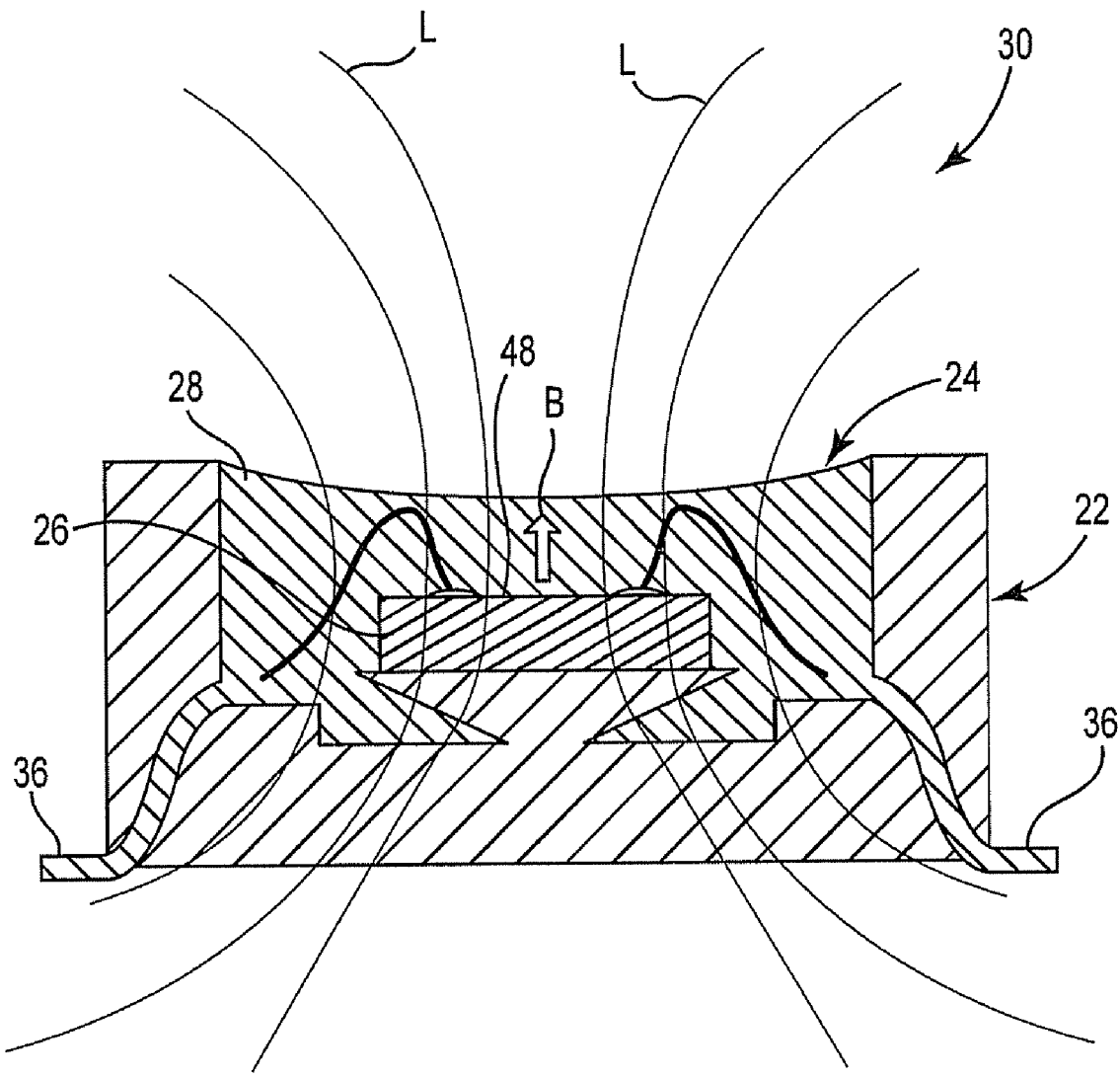
FIG. 3 is a schematic view of magnetic field lines extending through cast magnetic mold material for one embodiment of a semiconductor device.

FIG. 3 is a schematic cross-sectional view of semiconductor device 30 illustrating an embodiment in which magnetic mold material 28 is magnetized. In one embodiment, semiconductor device 30 is configured to shape the distribution and local strength of magnetic fields passing through device 30. In the presence of a magnetic field having a direction of magnetization illustrated at B, the magnetic field lines L pass through magnetic sensor chip 26 and are substantially perpendicular to active surface 48 of chip 26. In one embodiment, the housing 22 of semiconductor device 30 is configured to further shape and distribute the local strength of magnetic field B and includes one or more protruding elements within cavity 24 as further described in FIG. 5.

In one embodiment, both mold material 28 and housing are ferromagnetic, but have strongly different magnetic properties. For example, in one embodiment magnetic mold material 28 is a high coercivity ferromagnetic material and housing 22 is a molded carrier formed of a low coercivity ferromagnetic material. The high coercivity ferromagnetic mold material 28 is configured to provide the bias field, and the low coercivity ferromagnetic housing 22 is configured to provide flux conducting material that provides a path for the magnetic field lines.

Figure 4:
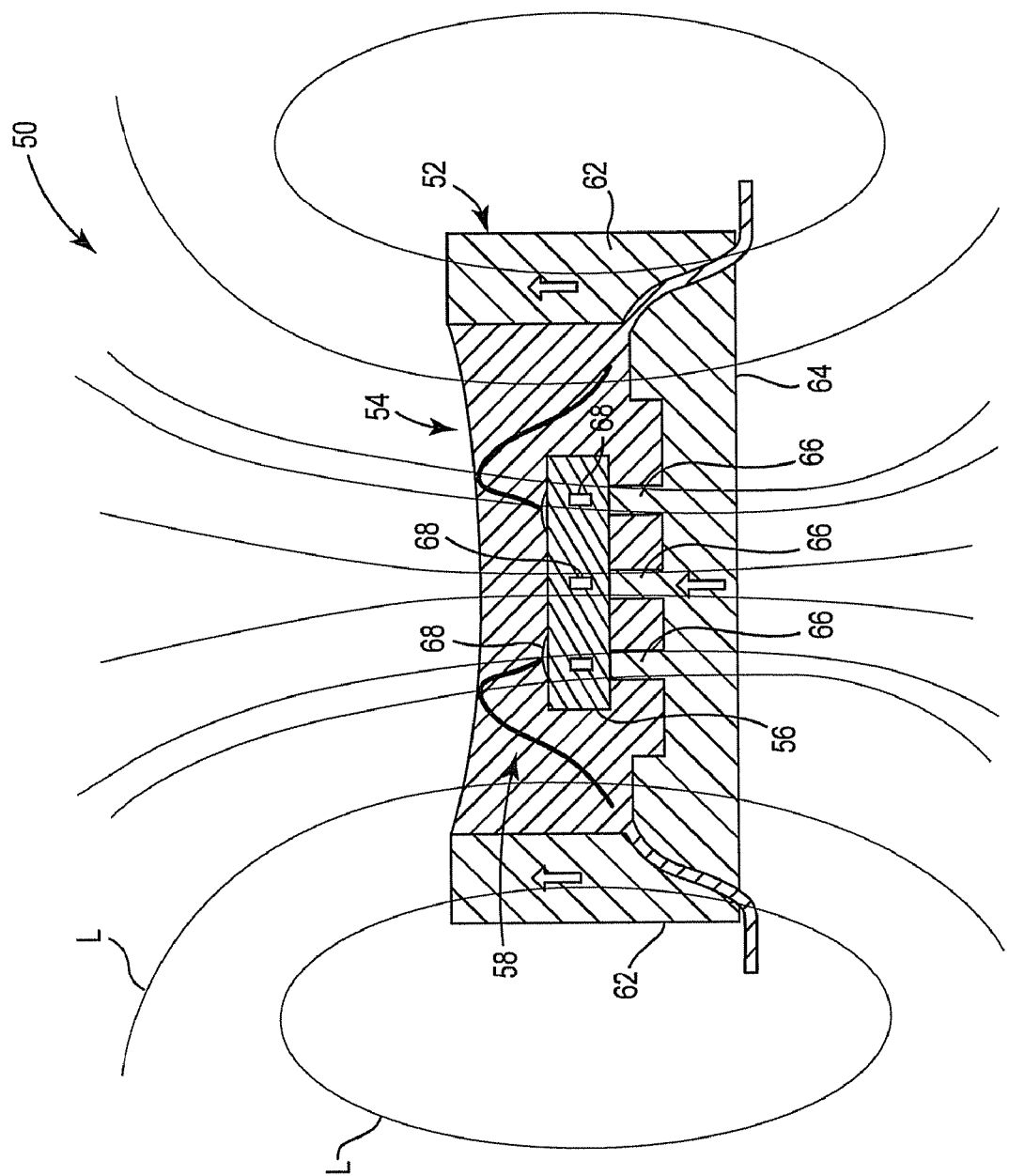
FIG. 4 is a schematic view of magnetic field lines extending through a magnetic housing for one embodiment of a semiconductor device.

FIG. 4 is a schematic cross-sectional view of an exemplary embodiment of a semiconductor device 50 in which housing 52 is magnetic and mold material 58 is non-magnetic. Semiconductor device 50 includes a magnetic housing 52 defining a cavity 54, a magnetic sensor chip 56 disposed in cavity 54, and non-magnetic mold material 58 covering magnetic sensor chip 56 and substantially filling cavity 54.

In one embodiment, magnetic housing 52 is molded or cast from a magnetic material similar to material 28 described above including permanent magnetic particles distributed in a polymer. Suitable non-magnetic mold materials 58 include plastic, epoxy, filled plastic, or other suitable transfer molding materials In one embodiment, magnetic housing 52 is configured to shape the distribution and local strength of magnetic fields present in or around magnetic sensor chip 56. In one embodiment, magnetic housing 52 is formed as a cup having sides 62 extending from a base 64, where base 64 is molded to integrally form one or more protruding elements 66. Magnetic sensor chip 56 is attached to protruding elements 66 and mold material 58 engulfs chip 56 and fills between protruding elements 66.

Magnetic sensor chip 56 is similar to magnetic sensor chip 26 (FIG. 2) and includes one or more magnetic sensors 68 that may be located near an edge of chip 56. When the magnetic material that forms housing 52 is magnetized (the arrows inside housing 52 indicate the direction of magnetization through magnetic housing 52), the magnetic fields lines L are formed through housing 52 and chip 56. In one embodiment, protruding elements 66 are configured to align with magnetic sensors 68 and shape the magnetic field lines L through magnetic sensors 68 of chip 56 to achieve substantially perpendicular field lines L relative to chip sensor 56.

Figure 5:
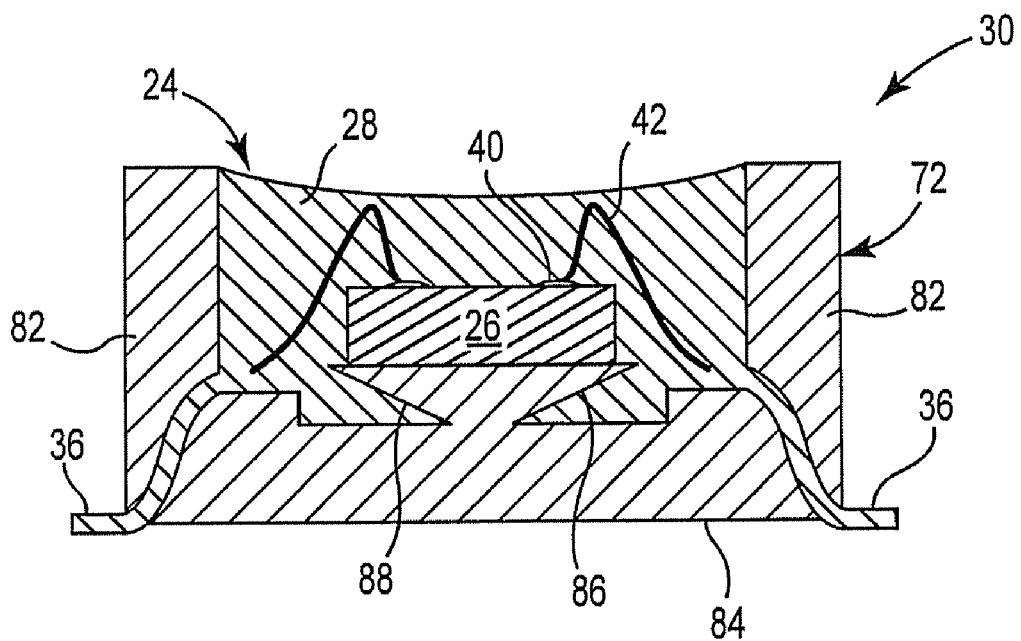
FIG. 5 is a schematic cross-sectional view of a semiconductor device including a housing defining a cavity and a protruding element formed within the cavity according to one embodiment.

FIG. 5 is a schematic cross-sectional view of semiconductor device 30 including a non-magnetic housing 72 having a protruding element 86 that is configured to shape the magnetic field lines through sensor chip 26. Similar to semiconductor device 30 illustrated in FIG. 3, housing 72 is provided with cavity 24 that is filled with magnetic mold material 28, and chip 26 is deposited in cavity 24 and electrically connected with external contact elements 36 by wires 42.

Suitable non-magnetic materials for housing 72 include plastic, epoxy, metals, or other suitable transfer molding materials. In one exemplary embodiment housing 72 is formed of an epoxy binder filled with silicon dioxide particles. In another exemplary embodiment housing 72 is molded from a plastic material such as a thermo-plastic material or a thermoset material. In one embodiment, housing 72 is formed of copper and is substantially non-magnetic.

In one embodiment, non-magnetic housing 72 is configured to shape magnetic fields lines passing through chip 26 and includes sides 82 extending from a base 84 and protruding element 86 connected to base 84. In one embodiment, protruding element 86 is provided as a non-magnetic layer placed between magnetic sensor chip 26 and base 84 of housing 72. In one embodiment, housing 72 is cup-shaped and protruding element 86 is molded as a cone such that a longitudinal cross-section of protruding element 86 defines a triangle, substantially as illustrated. In one embodiment, protruding element 86 includes an apex 88 attached to base 84 of housing 72 and a flat 90 to which chip 26 is attached. As best illustrated in FIG. 3, protruding element 86 is configured to shape the geometry of the magnetic field lines L passing through magnetic sensor chip 26 when magnetic mold material 28 is magnetized.

Figure 6:
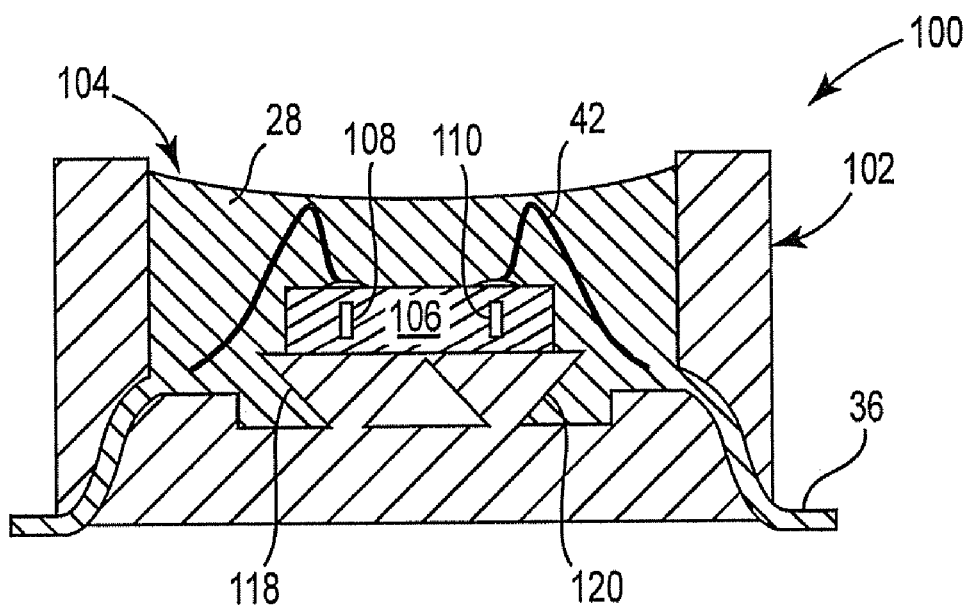
FIG. 6 is a schematic cross-sectional view of a semiconductor device including a housing defining a cavity and multiple protruding elements formed within the cavity according to one embodiment.

FIG. 6 is a schematic cross-sectional view of a semiconductor device 100 according to one embodiment. Semiconductor device 100 includes a housing 102 defining a cavity 104, magnetic sensor chip 106 disposed in cavity 104, and magnetic mold material 28 cast into cavity 104 and covering magnetic sensor chip 106.

In one embodiment, housing 102 is formed as a cup around cavity 104 and includes external contact elements 36 formed in housing 102 and configured to electrically communicate with magnetic sensor chip 106, for example by wires 42. Suitable materials for fabricating housing 102 include those described above relative to housing 22 (FIG. 2). Magnetic mold material 28 is as described above in FIG. 2 and is cast into cavity 104 to cover magnetic sensor chip 106 and substantially fill cavity 104.

In one embodiment, magnetic sensor chip 106 includes multiple sensors such as a first magnetic sensor 110 and a second magnetic sensor 108, and housing 102 includes a first protruding element 118 configured to shape magnetic field lines passing through sensor 108 and a second protruding element 120 configured to shape magnetic field lines passing through sensor 110. Protruding elements 118, 120 are configured to shape the magnetic field lines such that they are substantially perpendicular to chip 106 and pass through sensors 108, 110. In one embodiment, protruding elements 118, 120 are provided as a non-magnetic layer disposed between chip 106 and a bottom of cavity 104. In one embodiment, protruding elements 118, 120 are integrally formed with housing 102 such that housing 102 provides a monolithic housing having protruding elements 118, 120 aligned with magnetic sensors 108, 110 when chip 106 is attached to protruding elements 118, 120.

Figure 7:
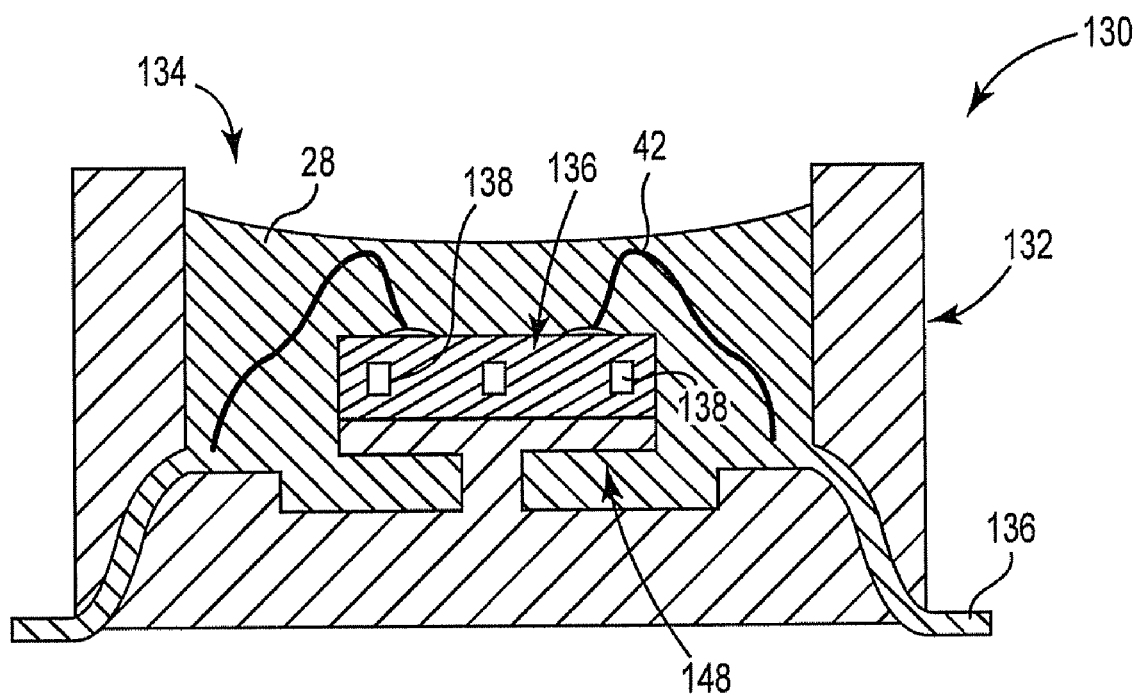
FIG. 7 is a schematic cross-sectional view of a semiconductor device including a housing defining a cavity and another embodiment of a protruding element formed in the cavity.

FIG. 7 is a schematic cross-sectional view of a semiconductor device 130 according to one embodiment. Semiconductor device 130 includes a non-magnetic housing 132 defining a cavity 134, a magnetic sensor chip 136 disposed in cavity 134, and magnetic mold material 28 cast into cavity 134.

In one embodiment, magnetic sensor chip 136 includes a plurality of magnetic sensors 138, and housing 132 includes an element 148 protruding from a base of cavity 134. Element 148 supports magnetic sensor chip 136 and is configured to shape magnetic field lines passing through magnetic sensors 138. In one embodiment, element 148 is integrally formed with housing 132 and is T-shaped in a manner that that directs the magnetic field lines perpendicularly through magnetic sensors 138. Magnetic sensor chip 136 is coupled to element 148 and electrically communicates with external contact elements 36 through wires 42.

In one embodiment, non-magnetic housing 132 is formed of an epoxy or a copper-containing metal and magnetic mold material 28 includes magnetic particles distributed in a polymer as described above.

Figure 8:
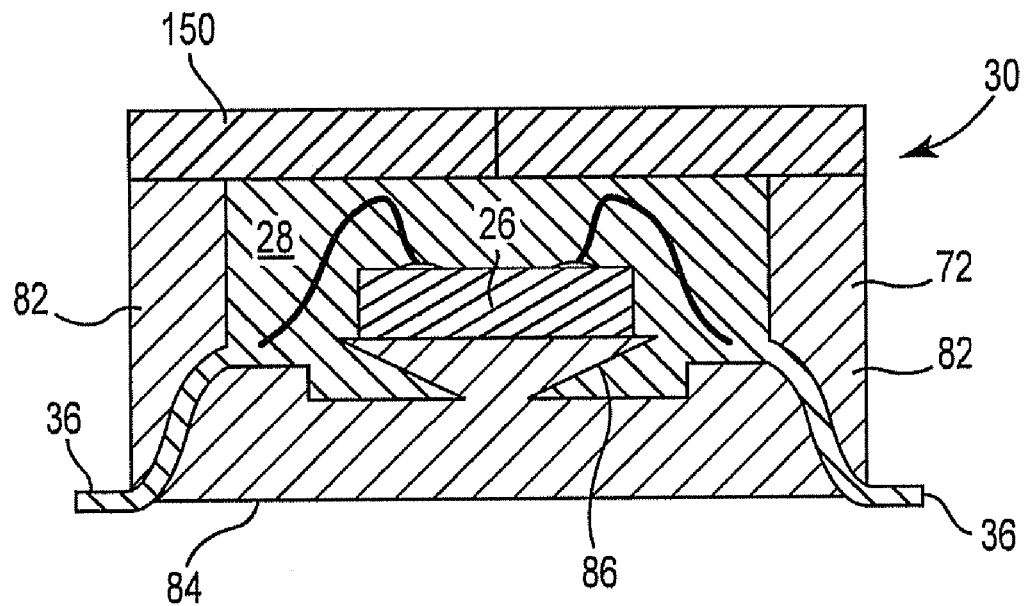
FIG. 8 is a schematic cross-sectional view of the semiconductor device illustrated in FIG. 5 including a cover placed over the cavity according to one embodiment.

FIG. 8 is a schematic cross-sectional view of semiconductor device 30 as illustrated in FIG. 5 and including a cover attached to housing 72. Cover 150 is provided to protect magnetic sensor chip 26 from harsh environments as may be encountered in automotive applications. When cover 150 is attached to housing 72, magnetic sensor chip 26 is enclosed on all sides.

In one embodiment, cover 150 is formed of non-magnetic materials. Suitable non-magnetic materials for cover 150 include plastic, epoxy, or metals. In one exemplary embodiment cover 150 is formed of an epoxy binder filled with silicon dioxide particles. In another exemplary embodiment cover 150 is molded from a plastic material such as a thermoplastic material or a thermoset material. In one embodiment, cover 150 is formed of copper and is substantially non-magnetic.

Figure 9:
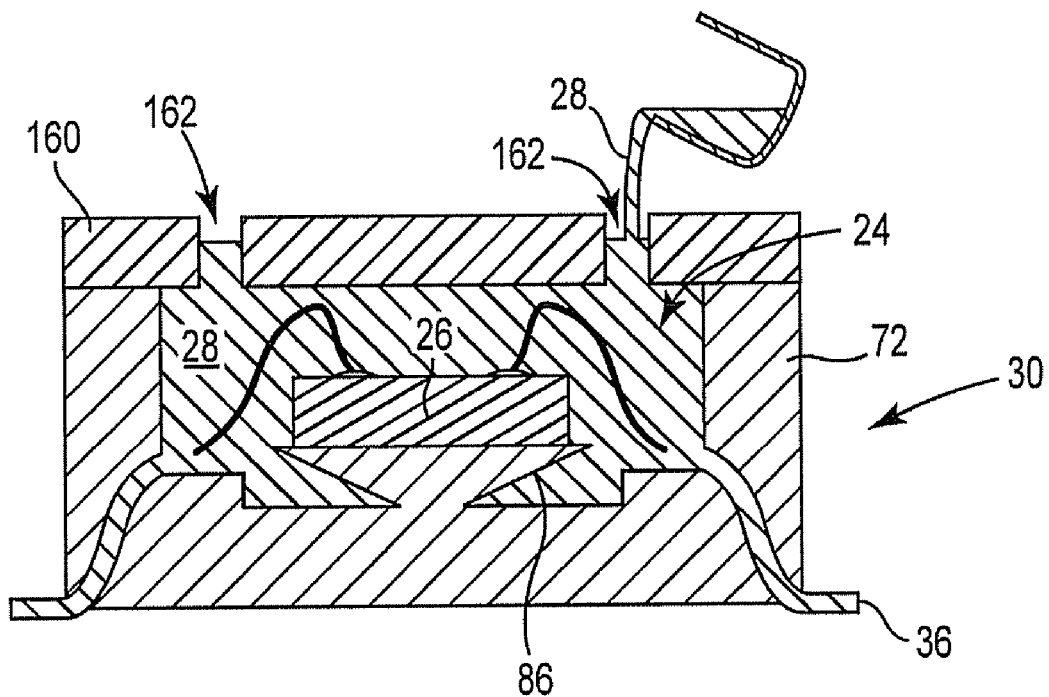
FIG. 9 is a schematic cross-sectional view of the semiconductor device illustrated in FIG. 5 including a cover placed over the cavity where the cover is provided with fill-openings according to one embodiment.

FIG. 9 is a schematic cross-sectional view of one embodiment of semiconductor device 30 including another protective cover 160 that forms an opening 162 communicating with cavity 24. Magnetic mold material 28 is provided as a liquid that is poured into one of the openings 162 to fill cavity 24 and enclose magnetic sensor chip 26. In one embodiment, cover 160 and openings 162 provide a mechanism by which a limited and defined volume of magnetic material 28 is controllably received by cavity 24.

When magnetic material 28 cures, semiconductor device 30 provides an enclosed package configured for attachment to other electronic devices by external contacts 36. The enclosure of housing 72 and cover 160 protect magnetic sensor chip 26 from dust, thermal shock, mechanical shock, and other extremes in the external environment. In one embodiment, it is desirable to form cover 160 from non-magnetic material such that when magnetic mold material 28 is magnetized, magnetic field lines pass through magnetic sensor chip 26 in a substantially perpendicular orientation with improved position and rotation sensing.

Embodiments described herein provide a magnetic sensor package including an integrally cast permanent magnet. The integrally cast permanent magnet is provided either as a housing material or as a cast material that fills the cavity where the chip is located. Embodiments provide for the shaping of magnetic field lines so that they are substantially perpendicular to the magnetic sensor chip within the package.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of magnetic sensor packages including an integral cast permanent magnet as discussed herein. Therefore, it is intended that this invention be limited only by the claims and the equivalents thereof.

What is claimed is:

1. A semiconductor device comprising:
a housing defining a cavity;
a magnetic sensor chip disposed in the cavity; and
mold material directly contacting at least three sides of the magnetic sensor chip and substantially filling the cavity;
wherein one of the housing and the mold material is ferromagnetic and an other of the housing and the mold material is non-ferromagnetic, and
wherein the housing comprises multiple external contact elements in electrical communication with the magnetic sensor chip.

2. A semiconductor device comprising:
a housing defining a cavity;
a magnetic sensor chip disposed in the cavity; and
mold material directly contacting at least three sides of the magnetic sensor chip and substantially filling the cavity;
wherein one of the housing and the mold material is ferromagnetic and an other of the housing and the mold material is non-ferromagnetic,
wherein the housing is molded from a polymer system comprising magnetic particles distributed in a polymer.

3. The semiconductor device of claim 2, wherein the magnetic particles comprise one of soft magnetic particles and hard magnetic particles.

4. The semiconductor device of claim 1, wherein the mold material comprises magnetic particles distributed in a polymer.

5. The semiconductor device of claim 4, wherein the magnetic particles comprise one of soft magnetic particles and hard magnetic particles.

6. The semiconductor device of claim 1, wherein the housing comprises a cover and is enclosed on all sides.

7. The semiconductor device of claim 1, wherein the magnetic sensor chip is connected with the external contact elements by one of wire bonds and solder balls.

8. The semiconductor device of claim 1, wherein the magnetic sensor chip comprises one of a Hall sensor, a magneto-resistor, a giant magneto-resistor, and an anisotropic magneto-resistor.

9. A semiconductor device comprising:
a housing defining a cavity;
a magnetic sensor chip disposed in the cavity;
mold material covering the magnetic sensor chip and substantially filling the cavity; and
a non-magnetic layer between the magnetic sensor chip and a base of the housing, the non-magnetic layer comprising a structure configured to shape magnetic field lines passing through the magnetic sensor chip;
wherein one of the housing and the mold material is magnetic and an other of the housing and the mold material is non-magnetic.

10. The semiconductor device of claim 9, wherein the non-magnetic layer is integrally formed with the housing.

11. The semiconductor device of claim 9, wherein the structure of the non-magnetic layer defines a triangle in longitudinal cross-section and the magnetic sensor chip is coupled to a base of the triangle.

12. A semiconductor device comprising:
a molded carrier defining a cavity;
a magnetic sensor chip located in the cavity; and
magnetic material cast in the cavity and directly contacting at least three sides of the magnetic sensor chip,
wherein the cavity of the molded carrier comprises a base, a protruding element extending from the base, and the magnetic sensor chip is attached to the protruding element.

13. A semiconductor device comprising:
a molded carrier defining a cavity;
a magnetic sensor chip located in the cavity; and
magnetic material cast in the cavity and directly contacting at least three sides of the magnetic sensor chip,
wherein the magnetic material comprises a high coercivity ferromagnetic material and the molded carrier comprises a low coercivity ferromagnetic material.

14. The semiconductor device of claim 12,
wherein the magnetic material comprises one of soft magnetic particles and hard magnetic particles.

15. The semiconductor device of claim 12, wherein the protruding element is molded integrally with the molded carrier.

16. The semiconductor device of claim 12, wherein the protruding element comprises a cone-shaped element with an apex of the cone-shaped element attached to the base of the cavity and the magnetic sensor chip is attached to a base of the cone-shaped element.

17. A method of manufacturing the semiconductor device of claim 12, the method comprising:
providing a carrier including a cavity formed in the carrier;
placing a chip in the cavity; and
casting magnetic material in the cavity and over the chip.

18. The method of claim 17, wherein the carrier comprises a plurality of external contact elements, and placing a chip in the cavity comprises electrically connecting the chip with the external contact elements.

19. The method of claim 17, wherein placing a chip in the cavity comprises attaching a chip to a protruding element formed within the cavity.

20. The method of claim 17, wherein casting magnetic material in the cavity and over the chip comprises casting a polymer system comprising soft magnetic particles distributed in a polymer into the cavity and over the chip.

21. The method of claim 17, wherein casting magnetic material in the cavity and over the chip comprises casting a polymer system comprising hard magnetic particles distributed in a polymer into the cavity and over the chip, the polymer system comprising a high coercivity ferromagnetic material and the carrier comprising a low coercivity ferromagnetic material.

22. The method of claim 17, wherein casting magnetic material in the cavity and over the chip comprises filling the cavity with a polymer system comprising one of soft and hard magnetic particles distributed in a polymer.

23. The method of claim 17, wherein the chip comprises a magnetic sensor chip comprising at least two magnetic sensor areas.

* * * * *